(12) United States Patent
Xia et al.

(10) Patent No.: US 7,414,847 B2
(45) Date of Patent: Aug. 19, 2008

(54) HEAT DISSIPATION DEVICE

(75) Inventors: Wan-Lin Xia, Shenzhen (CN); Tao Li, Shenzhen (CN); Wei-Qiang Tian, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/616,839

(22) Filed: Dec. 27, 2006

(65) Prior Publication Data

US 2008/0043445 A1    Feb. 21, 2008

(30) Foreign Application Priority Data

Aug. 18, 2006   (CN) .................. 2006 1 0062201

(51) Int. Cl.
*H05K 7/20* (2006.01)
(52) U.S. Cl. .................. 361/704; 361/719; 257/721; 257/718; 257/719; 257/727; 165/80.3
(58) Field of Classification Search ............... None
See application file for complete search history.

(56) References Cited

U.S. PATENT DOCUMENTS

| 4,745,456 | A   |   | 5/1988  | Clemens |           |
|-----------|-----|---|---------|---------|-----------|
| 6,648,664 | B1  | * | 11/2003 | McHugh et al. | 439/331 |
| 6,672,892 | B2  | * | 1/2004  | Chandran et al. | 439/330 |
| 6,678,160 | B1  | * | 1/2004  | Liu | 361/719 |
| 6,731,506 | B1  | * | 5/2004  | Dong et al. | 361/719 |
| 7,079,401 | B2  | * | 7/2006  | Lee et al. | 361/801 |
| 7,283,361 | B2  | * | 10/2007 | Lee et al. | 361/704 |

* cited by examiner

*Primary Examiner*—Boris L Chervinsky

(57) ABSTRACT

A heat dissipation device includes a retention module surrounding a heat-generating component therein and a heat sink secured in the retention module. The retention module has a plurality of sidewalls. The heat sink includes a base positioned in the retention module for contacting with the heat-generating component. The base includes a plurality of first walls and a plurality of second walls. The sidewalls of the retention module enclose a periphery of the base, and the first walls and the second walls respectively abut against the sidewalls of the retention module when the base is located at a first position and a second position. A rotation of the base from the first position to the second position reduces an adhering force generated by a thermal grease located between the base and the heat-generating component.

16 Claims, 5 Drawing Sheets

HEAT DISSIPATION DEVICE

BACKGROUND OF THE INVENTION

1. Field of the Invention

The present invention relates to a heat dissipation device, more particularly to a heat dissipation device for cooling an electronic component.

2. Description of Related Art

As computer technology continues to advance, electronic components such as the central processing units (CPUs) of computers are being made to provide faster operational speeds and greater functional capabilities. When a CPU operates at high speed in a computer enclosure, its temperature usually increases enormously. It is therefore desirable to dissipate the generated heat of the CPU quickly before damage is caused.

A conventional heat dissipation device for this purpose generally includes a base for contacting with a CPU restricted in a retention module, and a plurality of upright fins mounted on the base. Heat originating from the CPU is first absorbed by the base, and then is conducted to the fins to be dissipated to ambient air.

However, the air or clearance existing between the base and the CPU, results in a large heat resistance therebetween, which unduly affects the heat dissipating efficiency of the conventional heat dissipation device. In order to reduce the heat resistance, the base is generally kept in contact with the CPU by thermal conductive grease.

As is well known, the thermal conductive grease generally has a high stickiness, and adherence is generated between the base and the CPU. When there is a need to remove the heat dissipation device from the CPU, the adherence between the heat dissipation device and the CPU may result in movement of the CPU with the heat dissipation device. More particularly, the heat dissipation device is usually positioned in the retention module, and the removal of the heat dissipation device is restricted by the retention module. In such a situation, the heat dissipation device is usually vertically pulled out of the retention module along a direction perpendicular to the CPU. The adherence is so large that the CPU may be actually pulled out of the retention module together with the heat dissipation device, resulting in a possible damage to the CPU.

What is needed, therefore, is a heat dissipation device, which can overcome the above-described disadvantages.

SUMMARY OF THE INVENTION

A heat dissipation device comprises a retention module surrounding a heat-generating component therein and a heat sink secured in the retention module. The retention module has a plurality of sidewalls. The heat sink comprises a base positioned in the retention module for contacting with the heat-generating component. The base comprises a plurality of first walls and a plurality of second walls. The sidewalls of the retention module enclose a periphery of the base. The second walls are slantwise from the first walls and separated from the sidewalls of the retention module, respectively. Accordingly, the base is capable of rotating relative to the retention module before the heat sink is pulled away from the heat-generating component. By the rotation of the base relative to the retention module, a shearing force can be applied to a thermal grease between the base of the heat sink and the heat generating component, whereby an adhering force generated by the grease which adheres the heat sink to the CPU can be reduced. Thus, the heat sink can be easily vertically pulled away from the heat-generating component without causing the heat-generating component to move therewith.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
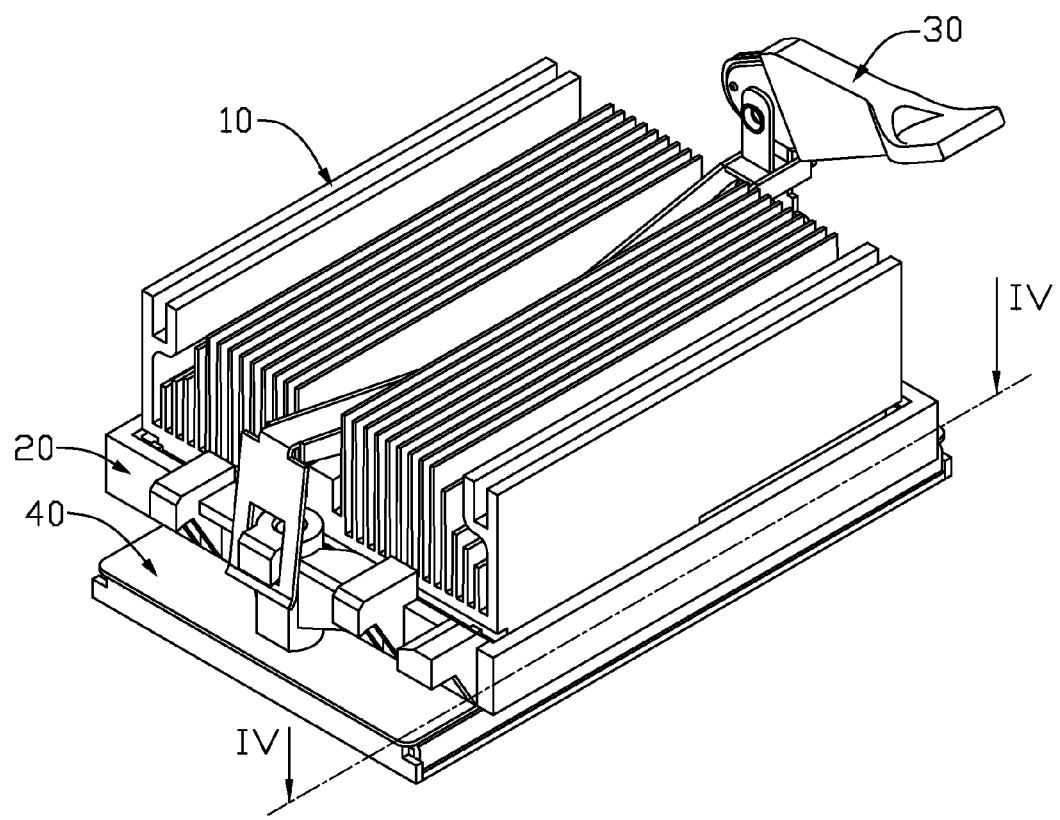
FIG. 1 is an isometric view of a heat dissipation device in accordance with a preferred embodiment, together with a printed circuit board.
Figure 2:
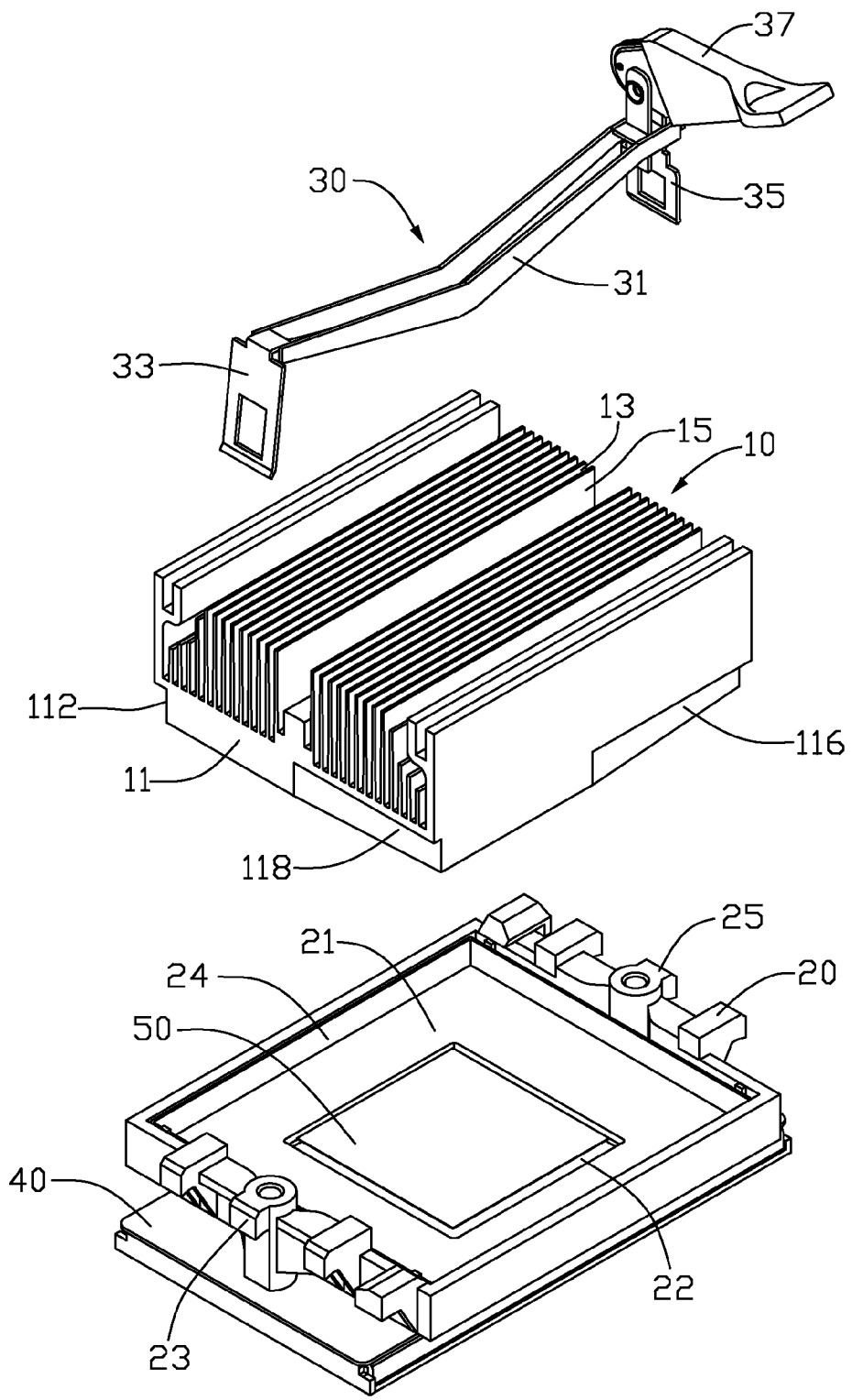
FIG. 2 is an exploded view of the heat dissipation device in FIG. 1.

Referring to FIGS. 1-5, a heat dissipation device in accordance with a preferred embodiment is illustrated. The heat dissipation device generally comprises a heat sink 10, a retention module 20 mounted on a printed circuit board 40 and a clip 30. The clip 30 secures the heat sink 10 in the retention module 20 to cool a heat-generating component, such as a CPU 50, which is mounted on the printed circuit board 40 and surrounded by the retention module 20.

The retention module 20 is usually pre-assembled on the printed board 40 and has a rectangular configuration. The retention module 20 defines an opening 22 therein for receiving the CPU 50. The retention module 20 further comprises four sidewalls 24 perpendicularly and upwardly extending from sides thereof, and a pair of protrusions 23, 25 extending outwardly from opposite sidewalls 24 of the retention module 20. The sidewalls 24 of the retention module 20 connect with each other in order; as a result, a rectangular space 21 is defined therebetween. The rectangular space 21 is provided for holding the heat sink 10 therein so that the CPU 50 can be cooled by the heat sink 10.

The heat sink 10 is made of a heat conductive material, and comprises a base 11 and a plurality of fins 13 mounted on a top surface of the base 11. The base 11 is positioned in the rectangular space 21 of the retention module 20 in such a manner that the sidewalls 24 of the retention module 20 enclose a periphery of the base 11. A bottom surface of the base 11 is used for contacting with the CPU 50. To reduce the heat resistance between the base 11 and the CPU 50, a layer of thermal conductive grease 60 may be pre-coated on a portion, generally a central portion of the base 11. The layer of heat conductive grease 60 should generally be of a size equal to that of the CPU 50. Alternatively, a layer of thermal conductive grease may be pre-coated on a top surface of the CPU 50.

As is well known, the thermal conductive grease 60 generally has a high stickiness, and an adherence is generated between the base 11 and the CPU 50. Therefore, the heat sink 10 and the CPU 50 are kept together via the thermal conductive grease 60. For facilitating removing the heat sink 10 away from the CPU 50 without movement of the CPU 50, the base 11 is designed to be capable of rotating relative to the retention module 20 to generate a shear force between the base 11 and the CPU 50 before the heat sink 10 is pulled away from the CPU 50. The shear force helps to reduce the adherence so that the heat sink 10 can be easily removed out of the retention module 20 without causing the CPU 50 to move therewith. The detailed structure of the base 11 will be described in the following text.

Figure 3:
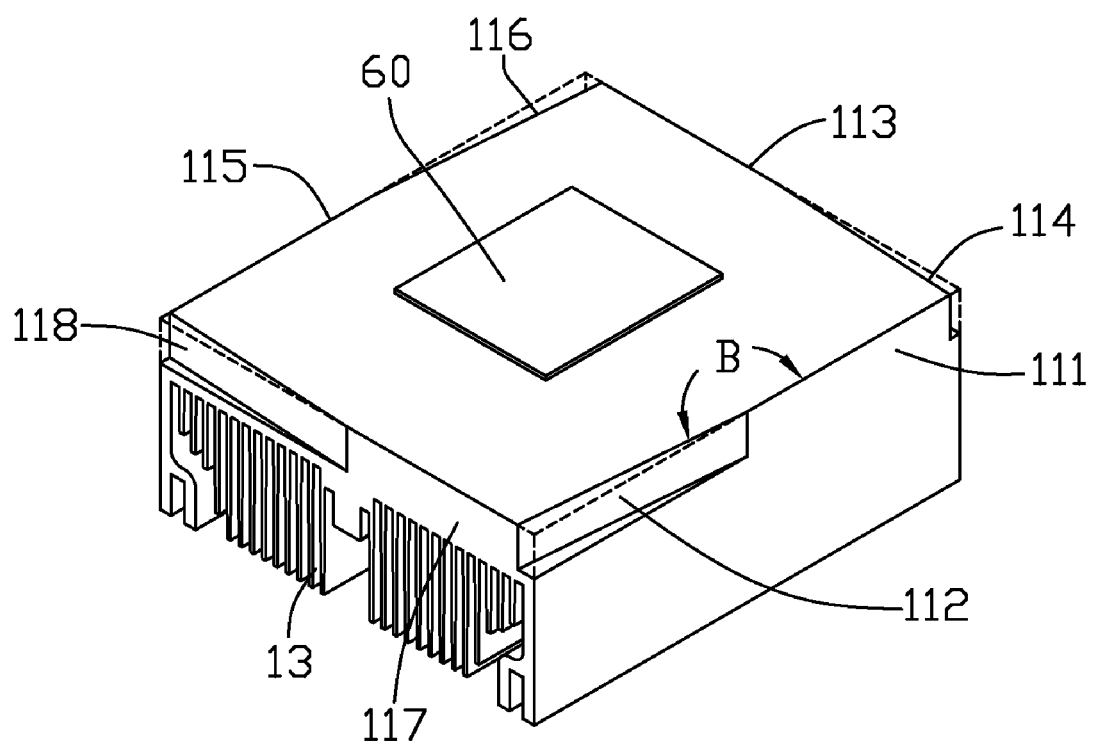
FIG. 3 is an isometric view of a heat sink in FIG. 2, viewed from another aspect.
Figure 4:
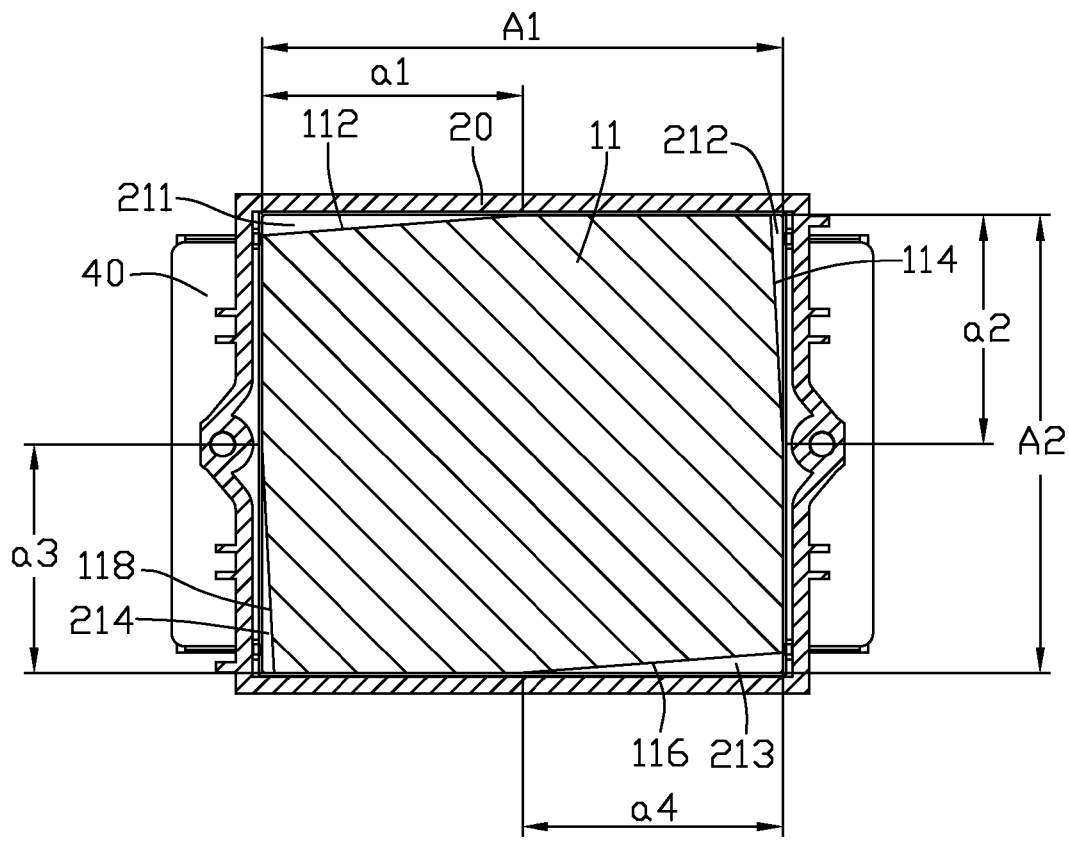
FIG. 4 is a cross-sectional view of the heat dissipation in FIG. 1 taken from a line IV-IV in FIG. 1, showing a base of the heat sink in a first position.
Figure 5:
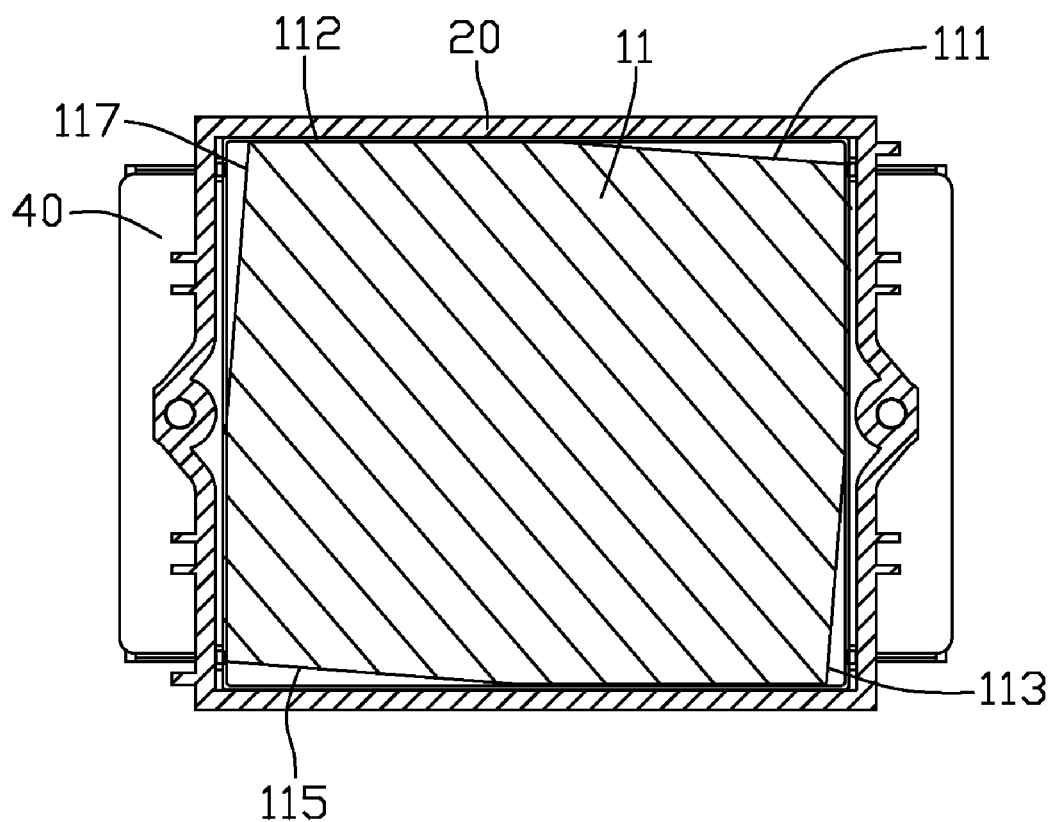
FIG. 5 is similar to FIG. 4, showing the heat sink in a second position.

As shown in FIGS. 3-5, the base 11 comprises a plurality of first walls 111, 113, 115, 117, and a plurality of second walls 112, 114, 116, 118 which are located in a rectangular space defined by the first walls 111, 113, 115, 117 and the extended surfaces of the first walls 111, 113, 115, 117. The first walls 111, 113, 115, 117 and the second walls 112, 114, 116, 118 are formed at intervals along the periphery of the base 11, and are oriented perpendicular to the bottom surface of the base 11. Each side of the base 11 comprises one first wall 111 (113, 115, 117) and one-second wall 112 (114, 116, 118). An angle, particularly an obtuse angle B, is defined by the first wall 111 (113, 115, 117) and the second wall 112 (114, 116, 118) located at a same side of the base 11. When viewed from a clockwise direction, each second wall 112 (114, 116, 118) is slightly and inwardly slanted from one neighboring first wall 111 (113, 115, 117) located at a common side of the base 11 with the each second wall 112 (114, 116, 118) to the other neighboring first wall 117 (111, 113, 115). Furthermore, the first walls 111, 115 (113, 117) located at opposite sides of the base 11 are parallel to each other. Meanwhile, the neighboring first walls 111,113, 115, 117 are perpendicular to each other.

By such design, the heat sink 10 is capable of being driven to rotate in the retention module 20 between a first position (shown in FIG. 4) and a second position (shown in FIG. 5).

At the first position, the heat sink 10 is secured in the retention module 20 to cool down the CPU 50 in such a manner that the first walls 111,113, 115, 117 abut against the sidewalls 24 of the retention module 20, while the second walls 112, 114, 116, 118 are kept away from the sidewalls 24 of the retention module 20. As a result, a plurality of interspaces 211, 212, 213, 214 are defined by the associated second walls 112, 114, 116, 118 and the sidewalls 24 of the retention module 20. In other words, the interspaces 211, 212, 213, 214 are disposed in corners of the retention module 20 and separated from one another by the base 11. In this preferred embodiment, the interspaces 211, 212, 213, 214 each have a wedge-like shape.

Moreover, the interspace 211 has a length $a_1$ along a direction parallel to both the bottom surface of the base 11 and the sidewall 24 of the retention module 20 that the second wall 112 faces. The interspace 213 has a length $a_4$ along a direction parallel to both the bottom surface of the base 11 and the sidewall 24 of the retention module 20 that the second wall 116 faces. The sum of $a_1$ and the $a_4$ is not smaller than a distance $A_1$ between the first walls 113 and 117. Similarly, the sum of $a_2$ and the $a_3$ is not smaller than a distance $A_2$ between the first walls 111 and 115. In this preferred embodiment, $a_1=a_4=A_1/2$, $a_2=a_3=A2/2$. By such design, the base 11 is capable of being driven to rotate relative to the retention module 20. As a result, the second walls 112, 114, 116, 118 replace the first walls 111,113, 115, 117 to abut the sidewalls 24 of the retention module 20. The heat sink 10 is thus positioned in the second position as shown in FIG. 5.

In the second position, the first walls 111,113, 115, 117 are kept away from the sidewalls 24 of the retention module 20, and the second walls 112, 114, 116, 118 abut against the sidewalls 24 of the retention module 20 instead of the first walls 111,113, 115, 117. In other words, the first walls 111, 113, 115, 117 and the second walls 112, 114, 116, 118 separately abut against the sidewalls 24 of the retention module 20 so that the base 11 is capable of rotating relative to the retention module 20. In an alternative embodiment, in the second position, not all of the second walls abut against the sidewalls of the retention module, and some of second walls may be still be kept away from the sidewalls of the retention module.

During the process of rotation of the heat sink 10 relative to the retention module 20 from the first position to the second position, the rotation is carried out in a space defined by the sidewalls 24 of the retention module 20 and in a plane parallel to the bottom surface of the base 11, without the base 11 moving away from the CPU 50 in a direction perpendicular to the bottom surface of the base 11. Therefore, only a shear force is induced between the base 11 and the CPU 50 without a force along a direction perpendicular to the base 11. This serves to prevent possible failure of the CPU 50 resulting from the movement of the heat sink 10 and the thermal conductive grease 60 relative to the CPU 50. The shear force efficiently reduces the adherence between the base 11 and the CPU 50, and then the heat sink 10 may then be easily removed from the retention module 20 along a direction perpendicular to the base 11. Therefore, the preferred embodiment of the present invention has overcome the disadvantage of the conventional heat dissipation device.

Additionally, since the base 11 is capable of moving relative to retention module 20, undue movement of the base 11 may lead to an increase in the heat resistance between the base 11 and the CPU 50. To prevent undue movement of the base 11 in the first position, the clip 30 is used to lock the heat sink 10 in the first position.

In this embodiment, the clip 30 comprises an elongated body 31 received in a groove 15 defined in the heat sink 10, a first hook plate 33, a second hook plate 35, and an actuating member 37 connected with the second hook plate 35. The first hook plate 33 and the second hook plate 35 are formed at opposite ends of the elongated body 31 for engaging with the associated protrusions 23, 25 of the retention module 20. The actuating member 37 is supported on the elongated body 31, and capable of rotating relative to the elongated body 31. When the actuating member 37 rotates from a released position to a fixing position, the second hook plate 35 enters into tightly engagement with the protrusion 25. Then, the elongated body 31 is deformed to exert a force pressing the heat sink 10 downwards towards the CPU 50. Thus, the heat sink 10 is locked in the first position to cool down the CPU 50.

When there is a need to remove the heat sink 10 from the retention module 20, the actuating member 37 is driven to rotate from the fixing position to the released position to cause the second hook plate 35 to disengage from the protrusion 25. Therefore, the clip 30 is easily removed. Then, the heat sink 10 is driven to rotate relative to the retention module 20 from the first position to the second position in a manner described above, and the shear force efficiently reduces the adherence between the base 11 and the CPU 50. Then the heat sink 10 is easily removed out of the retention module 20 along the direction perpendicular to the base 11.

As described above, the heat sink 10 of this preferred embodiment is capable of rotating relative to the retention module 20 less than one-quarter turn of the base 11. This helps to reduce the adherence between the base 11 and the CPU 50, and the heat sink 10 is easily removed away from the CPU 50 with only a small force acting on the top surface of the CPU 50.

Additionally, the heat sink 10 with the layer of thermal conductive grease 60 is positioned in the retention module 20 along the direction perpendicular to the bottom surface of the base 11, so that the bottom surface of the heat sink 10 tightly contacts with the top surface of the CPU 50. As a result, at the first position and when the clip 30 secures the heat sink 10 to the retention module 20, the base 11 of the heat sink 10 and the CPU 50 are in close contact with each other. This helps to improve the heat dissipating efficiency of the heat dissipation device.

Additionally, when the heat sink 10 is at the first position, the first walls 111, 113, 115, 117 abut against the sidewalls 24 of the retention module 20. This serves to prevent a center of the base 11 from moving relative to the retention module 20 along a direction parallel to the bottom of the base 11. This helps to aim the thermal conductive grease 60 at the top surface of the CPU 50, to ensure that the thermal conductive grease 60 is just positioned between the CPU 50 and the central portion of the base 11.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
a retention module surrounding a heat generating component therein, the retention module having a plurality of sidewalls; and
a heat sink secured in the retention module, the heat sink comprising a base positioned in the retention module for contacting with the heat generating component, the base comprising a plurality of first walls and a plurality of second walls;
wherein the sidewalls of the retention module enclose a periphery of the base, and the first walls abut against the sidewalls of the retention module and the second walls are separated from the sidewalls of the retention module, respectively, so that the base is capable of rotating relative to the retention module.

2. The heat dissipation device as claimed in claim 1, wherein the first walls and the second walls are formed at intervals along the periphery of the base.

3. The heat dissipation device as claimed in claim 2, wherein the base of the heat sink comprises a plurality of sides, and each side of the base comprises one of the first walls and a corresponding one of the second walls.

4. The heat dissipation device as claimed in claim 3, wherein each second wall is slanted inwardly from a neighboring first wall located at a common side of the base.

5. The heat dissipation device as claimed in claim 1, wherein an interspace is defined by each second wall of the base and a corresponding sidewall of the retention module neighboring the each second wall.

6. The heat dissipation device as claimed in claim 5, wherein the interspaces are disposed in corners of the retention module.

7. The heat dissipation device as claimed in claim 6, wherein the interspace has a wedge-like shape.

8. The heat dissipation device as claimed in claim 1, wherein the second walls are positioned in a rectangular space defined by the first walls of the base and extended surfaces of the first walls.

9. The heat dissipation device as claimed in claim 1, wherein the base is capable of rotating relative to the retention module less than one-quarter turn of the base.

10. The heat dissipation device as claimed in claim 1, wherein the base is capable of rotating relative to the retention module in a plane parallel to a bottom surface of the base without the base moving in a direction perpendicular to the bottom surface of the base.

11. The heat dissipation device as claimed in claim 1, further comprising a clip, which engages with the retention module to secure the heat sink in the retention module.

12. An electronic package, comprising:
an electronic component mounted on a printed circuit board;
a retention module secured on the printed circuit board, the retention module comprising a plurality of sidewalls surrounding the electronic component therein;
a heat sink comprising a base having a bottom surface for contacting with the electronic component, the base comprising a plurality of first walls and a plurality of second walls formed at intervals along a periphery of the base;
a layer of thermal conductive grease positioned between the electronic component and the bottom surface of the base, the thermal conductive grease generating an adherence between the base and the electronic component to keep the base in contact with the electronic component;
wherein the base of the heat sink is so configured that it is capable of being driven to rotate in the retention module between a first position and a second position, and a shear force is induced between the base and the electronic component during the rotation of the base to reduce the adherence so that the heat sink can be easily removed out of the retention module by a force pulling the heat sink away from the electronic component.

13. The electronic package as claimed in claim 12, wherein at the first position, the heat sink is secured in the retention module to cool down the electronic component in such a manner that the first walls abut against the sidewalls of the retention module, while the second walls are kept away from the sidewalls of the retention module; and wherein at the second position, the first walls are kept away from the sidewalls of the retention module thus causing the second walls to move towards the sidewalls of the retention module.

14. The electronic package as claimed in claim 12, wherein in the first position, an interspace is defined by each second wall of the base of the heat sink and a corresponding sidewall of the retention module neighboring the each second wall.

15. The electronic package as claimed in claim 12, further comprising a clip, which engages with the retention module to press the heat sink towards the electronic component.

16. The electronic package as claimed in claim 12, wherein the rotation of the base relative to the retention module is carried out in a space defined by the sidewalls of the retention module and in a plane parallel to the bottom surface of the base without causing the base to move away from the electronic component in a direction perpendicular to the bottom surface of the base.

* * * * *